(12) United States Patent
Bertin et al.

(10) Patent No.: US 7,226,816 B2
(45) Date of Patent: Jun. 5, 2007

(54) METHOD OF FORMING CONNECTION AND ANTI-FUSE IN LAYERED SUBSTRATE SUCH AS SOI

(75) Inventors: Claude L. Bertin, South Burlington, VT (US); Ramachandra Divakaruni, Somers, NY (US); Russell J. Houghton, Essex Junction, VT (US); Jack A. Mandelman, Stormville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/055,106

(22) Filed: Feb. 11, 2005

(65) Prior Publication Data
US 2005/0145983 A1 Jul. 7, 2005

Related U.S. Application Data

(62) Division of application No. 10/366,298, filed on Feb. 12, 2003, now Pat. No. 6,972,220, which is a division of application No. 10/066,759, filed on Feb. 6, 2002, now Pat. No. 6,596,592, which is a division of application No. 09/583,468, filed on May 31, 2000, now Pat. No. 6,396,121.

(51) Int. Cl.
*H01L 21/82* (2006.01)

(52) U.S. Cl. .................... 438/131; 438/270; 438/243; 438/600; 257/E23.147

(58) Field of Classification Search ................ 438/270, 438/259, 242–243, 700, 267, 311, 600, 467, 438/131–132; 257/330–333, 304–305, E23.147
See application file for complete search history.

(56) References Cited

U.S. PATENT DOCUMENTS 4,943,538 A 7/1990 Mohsen et al.
(Continued)

FOREIGN PATENT DOCUMENTS

JP 05-040720 5/1993
(Continued)

*Primary Examiner*—Thao X. Le
(74) *Attorney, Agent, or Firm*—Whitham, Curtis, Christofferson & Cook, PC; Anthony Canale (57) ABSTRACT

An anti-fuse structure that can be programmed at low voltage and current and which potentially consumes very little chip spaces and can be formed interstitially between elements spaced by a minimum lithographic feature size is formed on a composite substrate such as a silicon-on-insulator wafer by etching a contact through an insulator to a support semiconductor layer, preferably in combination with formation of a capacitor-like structure reaching to or into the support layer. The anti-fuse may be programmed either by the selected location of conductor formation and/or damaging a dielectric of the capacitor-like structure. An insulating collar is used to surround a portion of either the conductor or the capacitor-like structure to confine damage to the desired location. Heating effects voltage and noise due to programming currents are effectively isolated to the bulk silicon layer, permitting programming during normal operation of the device. Thus the potential for self-repair without interruption of operation is realized.

4 Claims, 7 Drawing Sheets

U.S. PATENT DOCUMENTS

| | | |
|---|---|---|
| 5,021,359 A | 6/1991 | Young et al. |
| 5,055,898 A | 10/1991 | Beilstein et al. |
| 5,208,177 A | 5/1993 | Lee |
| 5,266,829 A | 11/1993 | Hamdy et al. |
| 5,324,681 A | 6/1994 | Lowrey et al. |
| 5,331,196 A | 7/1994 | Lowrey et al. |
| 5,502,326 A | 3/1996 | Slotboom et al. |
| 5,504,027 A | 4/1996 | Jeong et al. |
| 5,504,033 A * | 4/1996 | Bajor et al. ............ 438/405 |
| 5,525,531 A * | 6/1996 | Bronner et al. ......... 438/152 |
| 5,528,062 A | 6/1996 | Hsieh et al. |
| 5,593,912 A | 1/1997 | Rajeevakumar |
| 5,606,188 A * | 2/1997 | Bronner et al. ......... 257/301 |
| 5,627,092 A | 5/1997 | Alsmeier et al. |
| 5,717,230 A | 2/1998 | Chua et al. |
| 5,744,386 A | 4/1998 | Kenney |
| 5,759,907 A | 6/1998 | Assaderaghi et al. |
| 5,770,484 A | 6/1998 | Kleinhenz |
| 5,770,875 A | 6/1998 | Assaderaghi et al. |
| 5,780,323 A | 7/1998 | Forouhi et al. |
| 5,786,240 A | 7/1998 | Look et al. |
| 5,811,869 A | 9/1998 | Seyyedy et al. |
| 5,831,301 A | 11/1998 | Horak et al. |
| 5,869,868 A | 2/1999 | Rajeevakumar |
| 5,893,735 A | 4/1999 | Stengl et al. |
| 5,904,507 A | 5/1999 | Thomas |
| 6,124,206 A | 9/2000 | Flietner et al. |
| 6,218,232 B1 * | 4/2001 | Heo ........................ 438/238 |
| 6,245,600 B1 * | 6/2001 | Geissler et al. ......... 438/149 |
| 6,281,095 B1 * | 8/2001 | Bolam et al. ............ 438/462 |
| 6,383,864 B2 | 5/2002 | Scheller et al. |
| 6,396,121 B1 | 5/2002 | Bertin et al. |
| 6,437,369 B1 | 8/2002 | Tang |
| 6,465,370 B1 | 10/2002 | Schrems et al. |
| 6,566,177 B1 | 5/2003 | Radens et al. |
| 6,953,979 B1 * | 10/2005 | Yamaguchi et al. ...... 257/446 |

FOREIGN PATENT DOCUMENTS

| | | |
|---|---|---|
| JP | 07-014800 | 1/1995 |
| JP | 08-088333 | 4/1996 |
| JP | 10-041511 | 2/1998 |

* cited by examiner

METHOD OF FORMING CONNECTION AND ANTI-FUSE IN LAYERED SUBSTRATE SUCH AS SOI

This application is a division of U.S. patent application Ser. No. 10/366,298, filed Feb. 12, 2003 now U.S. Pat. No. 6,972,220, which is a division of U.S. patent application Ser. No. 10/066,759, filed Feb. 6, 2002 (now U.S. Pat. No. 6,596,592, issued Jul. 22, 2003), which is a division of U.S. patent application Ser. No. 09/583,468, filed May 31, 2000 (now U.S. Pat. No. 6,396,121, issued May 28, 2002), and all of which are incorporated herein by reference.

BACKGROUND OF THE INVENTION

1. Field of the Invention

The present invention generally relates to increasing manufacturing yield of integrated circuit devices and, more particularly, to the formation of various anti-fuse structures in the bulk semiconductor substrate of silicon on insulator (SOI) wafers and similar layered substrates.

2. Description of the Prior Art

The advantages of increased functionality and performance of integrated circuit devices and increased economy of manufacture derived from increased integration density have led to substantial advances in lithography and other manufacturing processes that allow reduction of sizes of transistors, capacitors and other electronic circuit elements and substantial increases in integrated circuit complexity. As integrated circuit complexity increases, however, the likelihood of a malformation of some portion of the integrated circuit during manufacture increases as well. Therefore, it has been a common incident of integrated circuit design to provide for repair of wafers, chips and packages or modules containing the chips at virtually all stages of manufacture so that the expense of processing is not lost.

For example, if a yield or reliability failure is detected after significant wafer processing has been performed, the cost of processing to that point is not lost if performance of the chip can be restored. As other examples currently possible or foreseeable, electrostatic discharge (ESD) protection may be provided during manufacture and disconnected when modules are installed in a system, off-chip driver (OCD) strength can be set based upon load requirements and system failure can be repaired without powering down a system or replacing failed parts.

Such repairs are generally accomplished by the provision of fuses and anti-fuses as potential disconnections and connections that can be made to substitute redundant elements or circuits (e.g. memory cells or partitions) for structures which are defective or of sub-specification performance. Numerous structures and techniques for activating or programming both fuses and anti-fuses are known. In general, more current or voltage must be applied to activate anti-fuses than is required to activate (e.g. destroy/disconnect) a fuse. This fact is becoming more critical at increased integration densities and reduced operating and breakdown voltages due to the potential for damage to other circuit elements since excessive heat, voltage and/or current alone or in combination can damage device structures that are becoming more critical with improved performance. Additionally, fuses and anti-fuses require significant chip space (including separations to limit thermal effects) and placement among complex circuits of increased numbers of elements is often difficult.

To obtain highest performance from active devices that may be included in integrated circuits, the use of silicon-on-insulator (SOI) wafer has been generally adopted in recent years. SOI substrates have a relatively thick bulk silicon or other conductive material layer to provide mechanical strength and facilitate handling and packaging and a thin, very high quality monocrystalline silicon active device layer isolated from the bulk silicon by a layer of insulator, generally an oxide.

It is known (but not admitted to be prior art as to the present invention) to allow the structure of some elements formed in the active device layer to extend into the bulk silicon layer. A deep trench capacitor is an example of such a structure. While it is characteristic of SOI structures to be isolated from the bulk layer, such a structure for dynamic memory arrays is advantageous since the capacitor dielectric maintains electrical isolation while allowing the bulk layer to serve as a common electrode for capacitors of the array. While some other structures extending into the bulk silicon layer have been proposed for various purposes including improvement of heat transfer, the basic principle of electrical isolation of the bulk silicon layer from the active device layer must be observed. Further, since the SOI structure is of substantial cost relative to other structure providing lower active device performance, the cost of forming fuses and anti-fuses in terms of the cost of their respective "footprints" is substantial.

SUMMARY OF THE INVENTION

It is therefore an object of the present invention to provide an anti-fuse structure of small footprint size that can be arbitrarily located in an integrated circuit formed on an SOI substrate.

It is another object of the invention to provide an anti-fuse structure having low programming voltage and current and reduced thermal effect on surrounding elements.

It is a further object of the invention to provide an anti-fuse structure which is electrically and thermally isolated from the active device layer of an SOI substrate to avoid compromise of active devices and/or to increase the reliability of an integrated circuit formed therein.

In order to accomplish these and other objects of the invention, an integrated circuit and an anti-fuse structure therefor are provided and formed on a layered substrate including a first semiconductor layer and a second, selectively doped, semiconductor layer insulated therefrom, the anti-fuse comprising a first conductor extending from the first semiconductor layer into the second semiconductor layer and having a programmable element interposed between the first conductor and the second semiconductor layer, a second conductor extending from a surface of the first semiconductor layer to a surface of the second semiconductor layer, and an insulating collar surrounding at least one of the first conductor and said second conductor.

In accordance with another aspect of the invention, a method of making a semiconductor device in a layered substrate comprising first and second semiconductor layers separated by an insulator layer is provided comprising forming a first aperture in the first semiconductor layer and insulator layer to the second insulator layer, forming a second aperture in through the first semiconductor layer and insulator layer extending into the second insulator layer, forming a thin insulator in the second aperture, forming a thick insulator collar in a portion of the first aperture or second aperture, and forming conductors in the first and second apertures.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
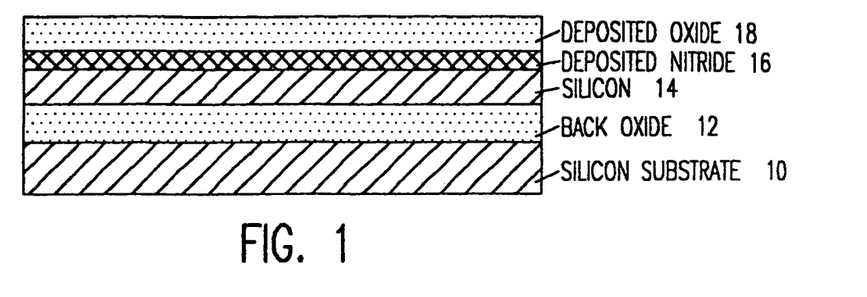
FIGS. 1, 2, 3, 4 and 5 are cross-sectional views illustrating manufacture of a first embodiment of the invention.

Referring now to the drawings, and more particularly to FIG. 1, there is shown, in cross-sectional view, a starting wafer for formation of an anti-fuse in accordance with a first embodiment of the invention. As is characteristic of silicon-on-insulator (SOI) wafers, a relatively thick bulk silicon layer 10 is provided to provide mechanical robustness and facilitate handling and to provide an electrically conductive ground plane. For purposes of the practice of the invention, however, this bulk silicon is preferably formed or treated (e.g. implanted) to include dopants that regulate the bulk resistance to a desired value, as will be discussed in greater detail below. The bulk silicon is covered with an insulator 12, generally an oxide (and thus referred to as a back oxide or BOX), and the insulator is covered by a thin monocrystalline silicon layer 14 of extremely high quality, often referred to an active device layer.

It should be understood that, while the invention will be described in terms of a SOI wafer because application to such a wafer is preferred by the inventors at the present time, that application is to be regarded as exemplary. The invention is fully applicable to other layered wafers and chips, as will be evident to those skilled in the art.

The active device layer 14 is covered by a deposited nitride layer 16 which is, in turn covered by a deposited oxide layer 18. As is known, oxide and nitride can be etched selectively to each other and to silicon and the hardness of nitride provides utility as an etch stop and/or a polish stop.

Figure 2:
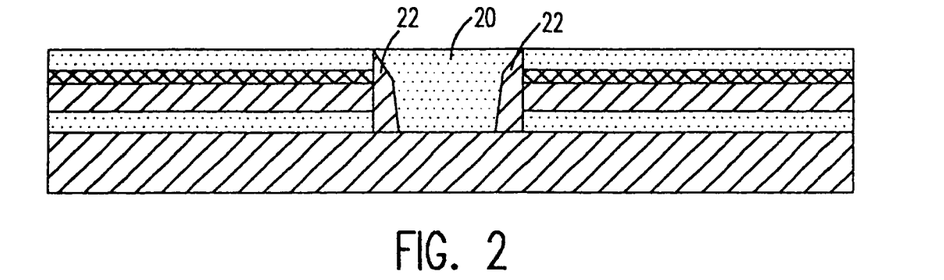

As illustrated in FIG. 2, the oxide 18, nitride 16, silicon layer 14 and back oxide 12 are opened by etching, in accordance with a resist (not shown) that can be patterned by any suitable process, using the bulk silicon layer 10 as an etch stop (relative to the etchant for oxide 12) to form an aperture 20. Oxide 18 serves as a hard mask during the etching of SOI layer 14. Highly conductive sidewalls 22 (e.g. P+ silicon) are then selectively formed by isotropic deposition and anisotropic etching. These conductive spacers serve to connect the bulk silicon layer 10 to the active device layer 14. It should be noted that P+ sidewalls are appropriate only for connecting p regions in SOI/active layer 14 with a p type substrate 10 or p well therein (to avoid formation of a junction diode, and that n+ spacers should be used in n regions for the case of an n type SOI region or an n type substrate or well. The aperture between the conductive sidewalls 22 is filled with CVD oxide and planarized.

Figure 3:
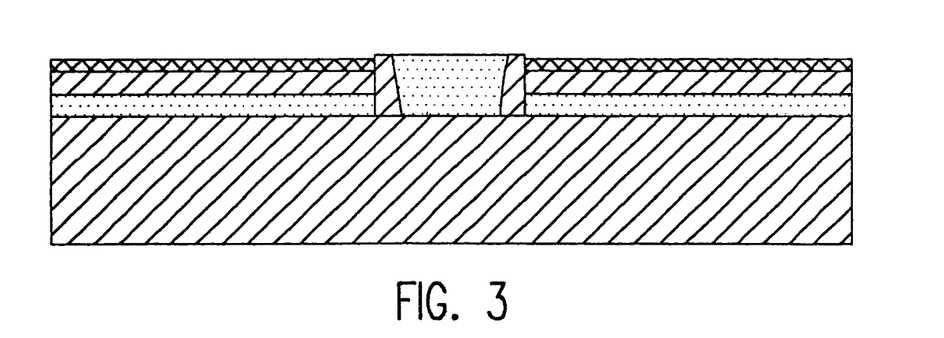

Next, as shown in FIG. 3, oxide layer 18 is removed by polishing to the nitride layer 16. This removal of the oxide 18 provides planarization for subsequent lithographic processes and also exposes the conductive spacer, to be later formed as a terminal connected to both the active silicon layer 14 and the bulk silicon 10. At this point, a non-programmable contact to the bulk silicon layer 10 and the active silicon layer 14 of the SOI wafer has been completed.

It should be appreciated that an anti-fuse can be used in several ways. The nature of the use will affect the nature of the structure of the anti-fuse. In accordance with the invention, the bulk silicon is used as a more or less resistive connection having two or more contacts. More specifically, the nature of the anti-fuse will depend on the other structures in the immediate environment of the anti-fuse on the chip, the nature of the functional repair to be made and the simultaneity of signals on the chip.

If, for example, an anti-fuse in accordance with the invention is used to repair a broken conductor, the bulk silicon layer resistance should be low and isolation should be provided between the anti-fuse and any other anti-fuse if, in accordance with the integrated circuit design, signal can be simultaneously present at two or more anti-fuses. Isolation can be provided in the bulk silicon wafer by any known process or by formation of discrete impurity wells (e.g. by implantation and diffusion). In practice, the number of anti-fuses on a chip may be relatively small and the number of impurity wells may be correspondingly limited with relatively wide tolerances for registration.

It is somewhat more common to "read" anti-fuses by applying voltages to a common (non-programmable) terminal, as described above, of a plurality of anti-fuses and to connect the other (programmable) terminal to the gate of a transistor that provides the desired connection. (The reverse or these connections may also be employed.) In such a case, specific resistance of the bulk silicon layer 10 can be relatively high and little or no isolation of the anti-fuses need be provided in the bulk silicon layer, especially if voltages are applied sequentially to conduction terminals of the transistors to read the anti-fuses sequentially, as is preferred.

Sequential reading of the anti-fuses is preferred and may be easily accomplished at power-up of the chip so that the relatively high resistance does not cause voltage drops in the bulk substrate which could be sensed as cross-talk between the anti-fuses and cause erroneous operation. Although the change in resistance (Gigaohms to hundreds of Kilohms but substantially less change, say to tens of Megohms, is possible) when the anti-fuse is programmed, the resistance remains quite high and the transistor functions essentially as an amplifier. Such an amplifier, if implemented with a field effect transistor has a very high input impedance and sequential reading is not always necessary and the state of the transistor may be maintained with little likelihood of cross-talk. However, to minimize likelihood of effects of cross-talk between anti-fuses, it is much preferred to initially energize the transistors sequentially. A latch can also be used to read the anti-fuse and maintain the data so read.

Figure 3A:
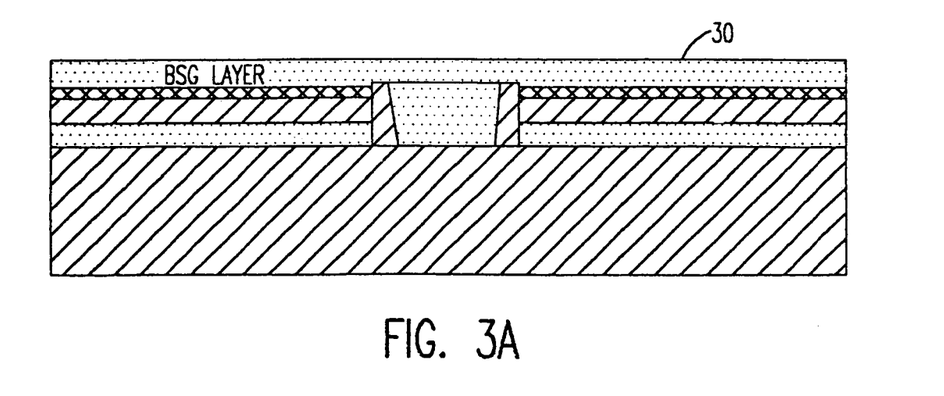
FIGS. 3A, 3B, 3C, 3D, 3E, 3F and 3G illustrate details of contact and isolation structure formation between the stages illustrated in FIGS. 3 and 4, FIG. 5A further illustrates contact formation.
Figure 3B:
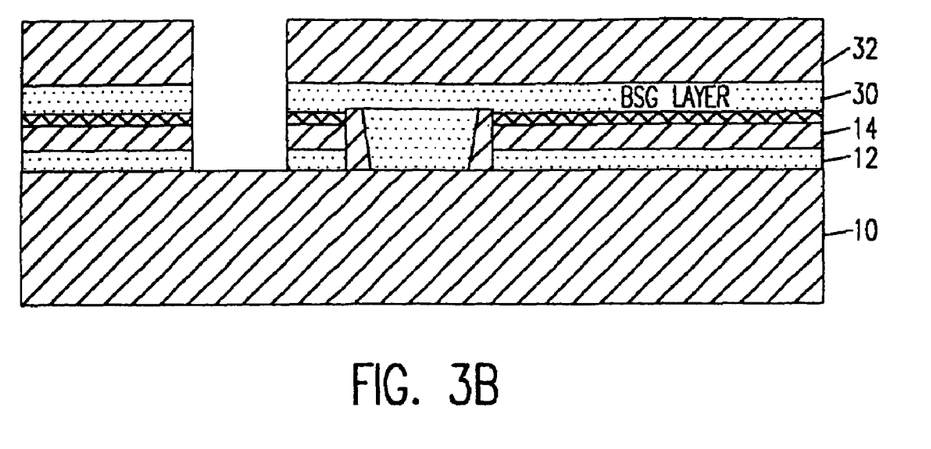
Figure 3C:
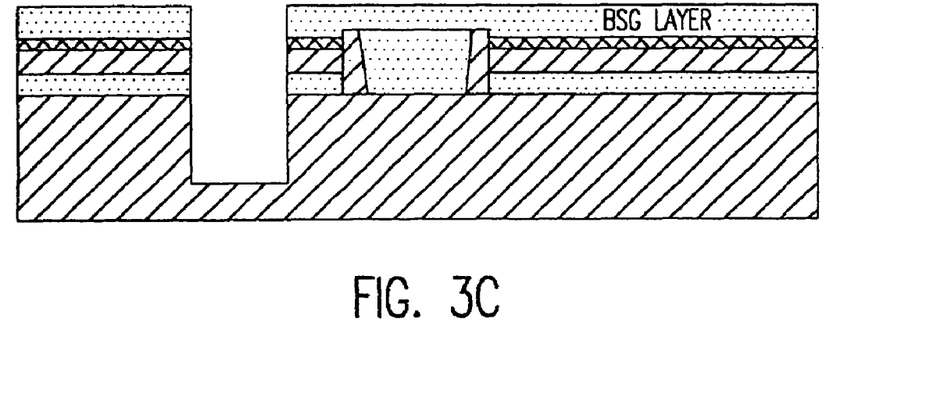

The formation of a complementary programmable contact to the bulk silicon layer 10 will now be described with reference to FIGS. 3A–3G. In FIG. 3A, a blanket borosilicate glass (BSG) layer 30 is shown, applied over the structure illustrated in FIG. 3. A photo-resist layer 32 is applied thereover and patterned in accordance with the desired anti-fuse location and dimensions. The BSG layer 30, nitride layer 16, SOI active layer 14 and back oxide 12 are then etched, stopping at substrate 10 as shown in FIG. 3B, The resist 32 is then stripped and the bulk silicon 10 is etched using the etched BSG as a hard mask. This results in a deep trench within the bulk silicon wafer.

Figure 3D:
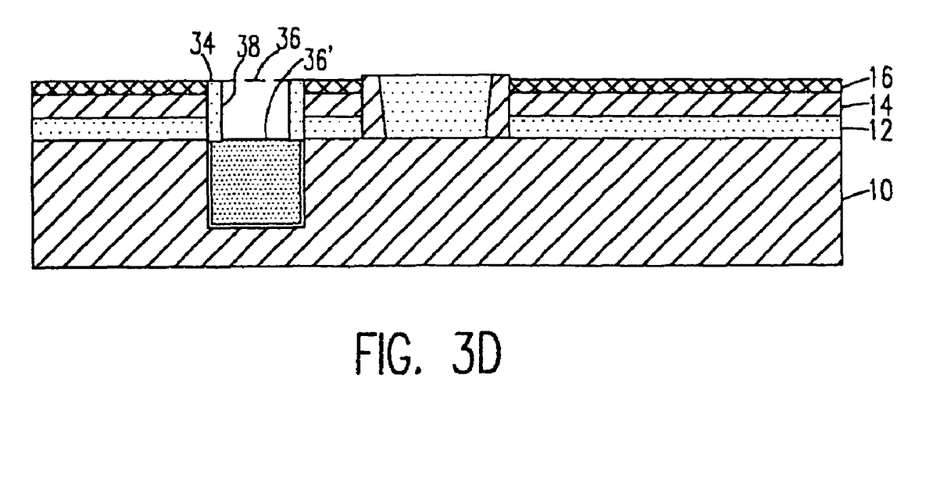
Figure 3E:
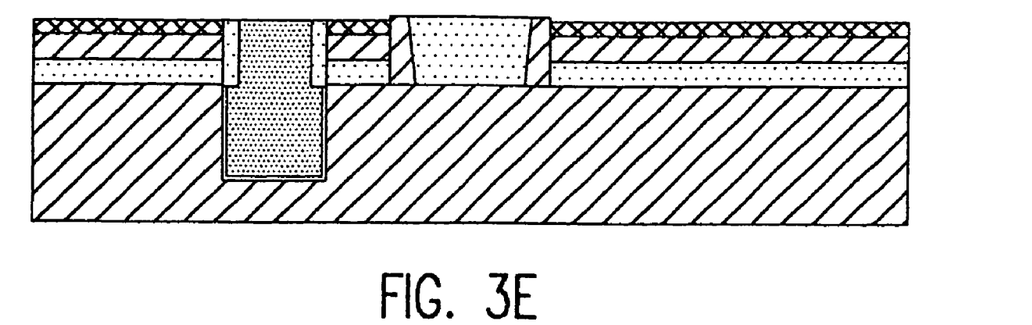

Then, as shown in FIG. 3D, a thin dielectric layer 34 is deposited or grown on the interior of the trench. This dielectric preferably is similar to a trench capacitor dielectric as used in memory arrays. The trench is then filled with doped polysilicon (indicated by dashed line 36) and planarized to nitride layer 16, removing the BSG. The doped polysilicon is then recessed to 36' and a thick collar oxide 38 is formed for isolation from the active device layer 14 of the SOI wafer from the remaining interior of the trench in which a second deposit of doped polysilicon is placed and planarized, as shown in FIG. 3E. (Alternatively, the etch described above in connection with FIG. 3B could be stopped at the back oxide 12 and the thick collar 38 formed before the back oxide 12 is opened by further etching to the substrate 10.) It will be recognized by those skilled in the art that this structure is substantially that of a trench capacitor with the doped polysilicon inside the trench forming one capacitor plate and the bulk silicon and the non-programmable contact of FIG. 3 forming the second capacitor electrode.

Figure 3F:
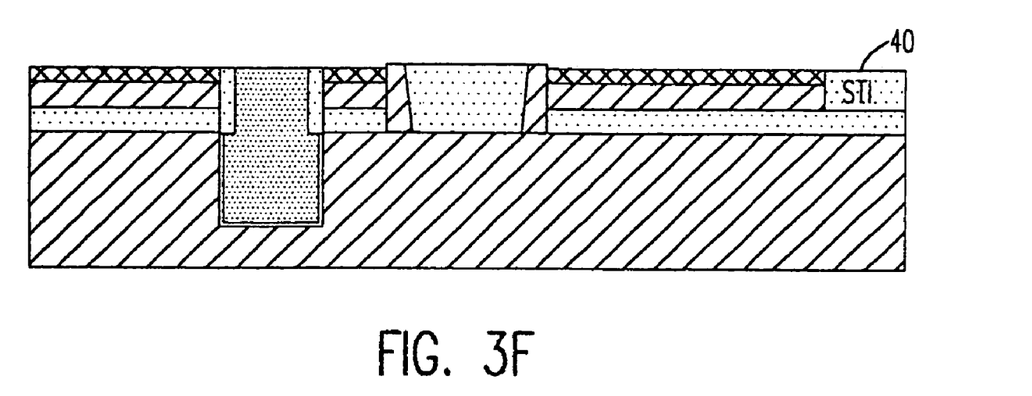
Figure 5:
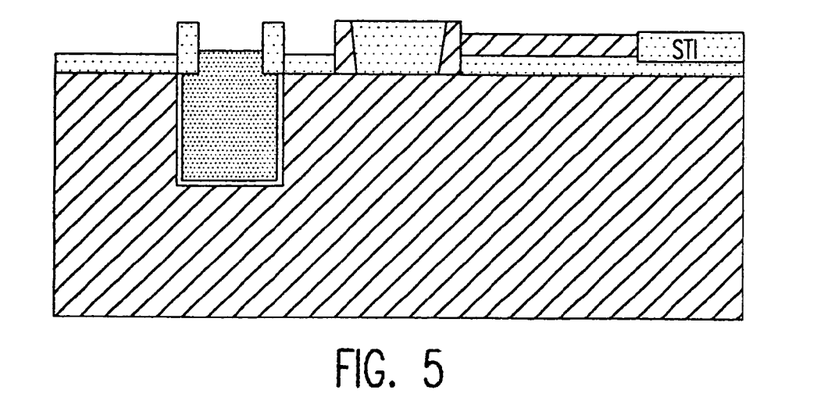
Figure 5A:
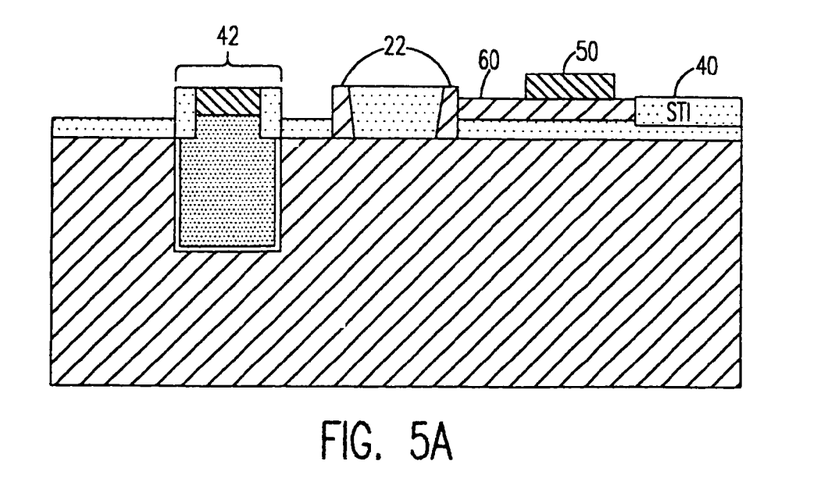
Figure 6:
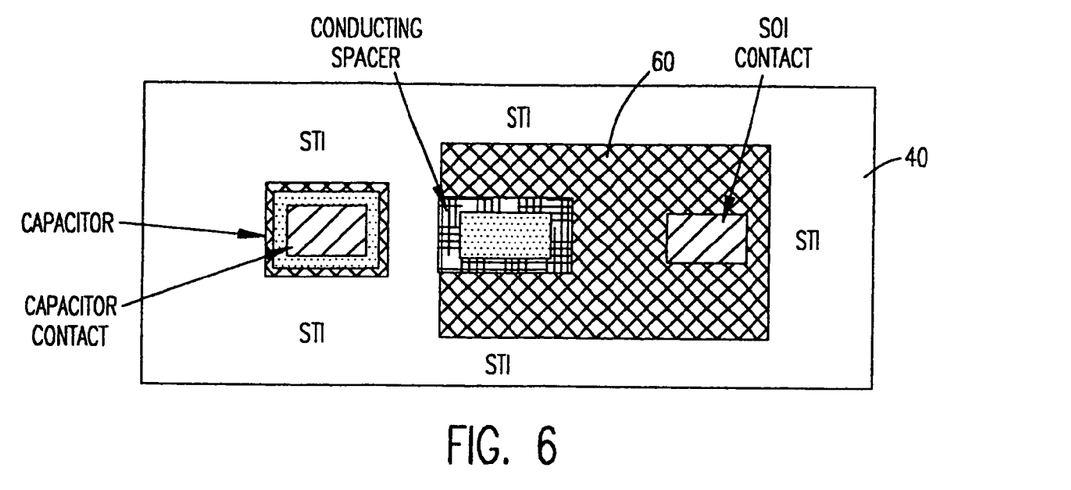
FIG. 6 is a plan view of an anti-fuse and isolation structure in accordance with the invention.

While the anti-fuse is substantially complete (less contact connections and other perfecting feature which will be discussed below in regard to FIGS. 4, 5 and 5A) as shown in FIG. 3E, the active device layer 14 of the SOI wafer remains connected to the conductive doped bulk silicon layer 10 where other devices are to be formed. Therefore, as shown in FIG. 3F the nitride 16 and active silicon layer 14 are etched to form a trench surrounding the anti-fuse and an insulator deposited there to form a shallow trench isolation (STI) structure 40. An exemplary pattern for the isolation structure is shown in FIG. 6.

The nitride is then stripped to leave the SOI structure with anti-fuse devices in place, ready for formation of additional circuits on the remainder of the chip including but not limited to transistors and memory cells in any manner appropriate to SOI processing. Since no portion of the circuitry of the integrated circuit other than the anti-fuse has been formed, there is no compromise of the heat budget for fabrication of these circuits by the formation of the anti-fuses.

By the same token, the avoidance of any effect on heat budget of the formation of the first embodiment of the invention generally allows some margin for the effects of heat generated by programming the device after other components of the integrated circuit have been formed and even subsequent to packaging and placement of the integrated circuit in service. The thermal isolation provided by STI 40 also serves to minimize thermal effects of programming. Nominal operating conditions also provide a margin for thermal effects without deleterious effects on the integrated circuit. Therefore, the invention provides support for the capability of self-repair of integrated circuits during operation to substitute functional circuitry for other circuitry which may become marginal or non-functional.

Figure 3G:
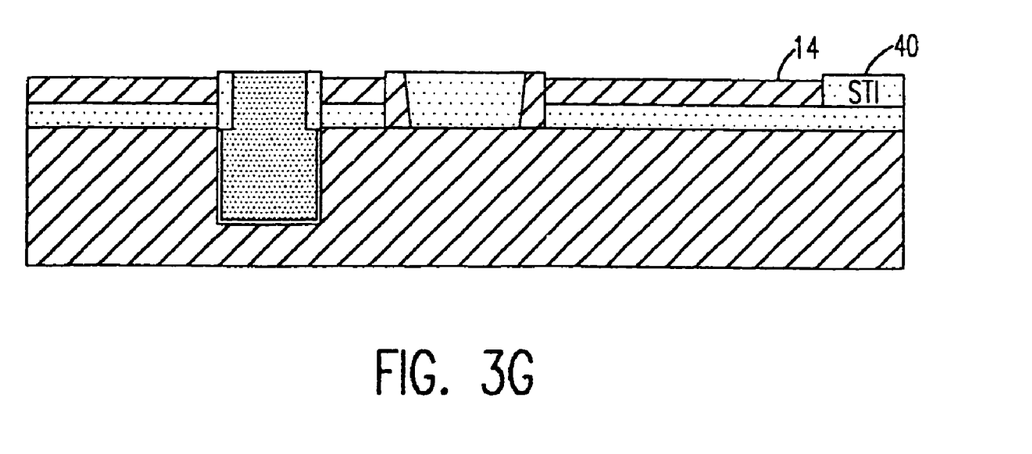
Figure 4:
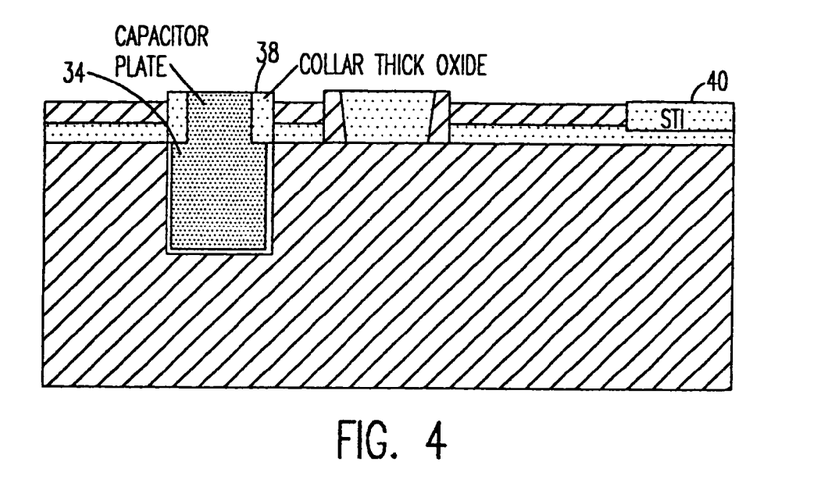

FIG. 4 is substantially the same as FIG. 3G but additionally illustrates programming of the anti-fuse. Preferably, programming is performed by applying a voltage sufficient to cause breakdown of the capacitor dielectric 34 but the damage could be achieved in other ways such as laser irradiation from the back side of the chip. For a 6 nm thickness of dielectric 34, corresponding to a 0.2 micrometer minimum feature size regime, programming can be achieved at about 6.9 volts, depending on the dielectric composition. For preferred dopant levels, breakdown by use of such a voltage causes a resistance change from about 300 gigaohms in the unprogrammed state to about 100K ohms in the programmed state.

The thicker collar 38 in the trench at the level of the active silicon layer 14 assures that such a programming voltage will not cause breakdown to SOI layer 14 during application of the programming voltage. Additionally, it is considered desirable but not necessary to the practice of the invention to use a blockout mask and etch the SOI active device layer 14 away surrounding the programmable deep trench contact of FIGS. 3A-3G and 4 as shown in FIG. 5 to further increase resistance to breakdown. It is also preferred to leave part (e.g. 60) of the SOI active layer 14 within the isolation structure 40, as shown is FIGS. 5 and 6. This portion of silicon facilitates formation and adhesion of a metal contact 50 for providing a connection to the bulk silicon layer 10 through spacer 22 as shown in FIG. 5A.

Programming current is about 100 microamps and heating during programming is minimal and, especially since the back oxide 12 and STI 40 are effective thermal barriers and the heat generated by programming current is substantially confined to and may be easily dissipated from the bulk silicon, no thermal damage to nearby integrated circuit elements is caused. By the same token, the programming current is isolated from the active silicon layer by the same structures and insulators surrounding at least one of the contacts to the anti-fuse and substantially confined to the bulk silicon, avoiding not only damage to the active layer devices but also isolating the active layer devices from the effects of noise due to programming current. Therefore, anti-fuses may be programmed while the integrated circuit remains in operation. Many methods of developing suitable voltages for programming are known in the art and, in any event, are not critical to the practice of the invention.

The embodiment of the invention described above can be fabricated at small size and does not significantly compromise the chip area available for integrated circuit elements, even when several hundred anti-fuses are provided on the chip. It should also be understood that the non-programmable contact may be common to a large number of programmable structures and may be omitted entirely if a connection to the bulk silicon layer is made on the back side of the chip. On the other hand, the need for STI at the active layer level requires an amount of space surrounding the programmable contact as shown in the plan view of FIG. 6; preventing an optimally small configuration from being realized. The avoidance of effects on the heat budget of the remainder of the integrated circuit also requires that the locations be planned in accordance with the remainder of the integrated circuit design.

A further embodiment of the invention which provides a size advantage and improvement in contact area of an anti-fuse in accordance with the invention will now be explained in regard to FIGS. 7-10. This embodiment has minimal effect on heat budget of the integrated circuit during manufacture which can generally be accommodated but provides a contact that can be selectively placed at any location after the integrated circuit elements are formed and at minimum lithographic feature size. It should be noted that a thick insulating collar surrounding trench polysilicon 72' is not necessary in this embodiment since electrical access to the anti-fuse is through strap 74 and contact between polysilicon 72 in the trench and the SOI layer is desirable. Breakdown is avoided by spacers 90 which form an insulating collar around conductor 100, as will be described below. Additionally, as alluded to above, it may be more desirable for some applications of this embodiment to provide separate conductive regions (e.g. strips) in the bulk material than in the embodiment of the invention described above.

Figure 7:
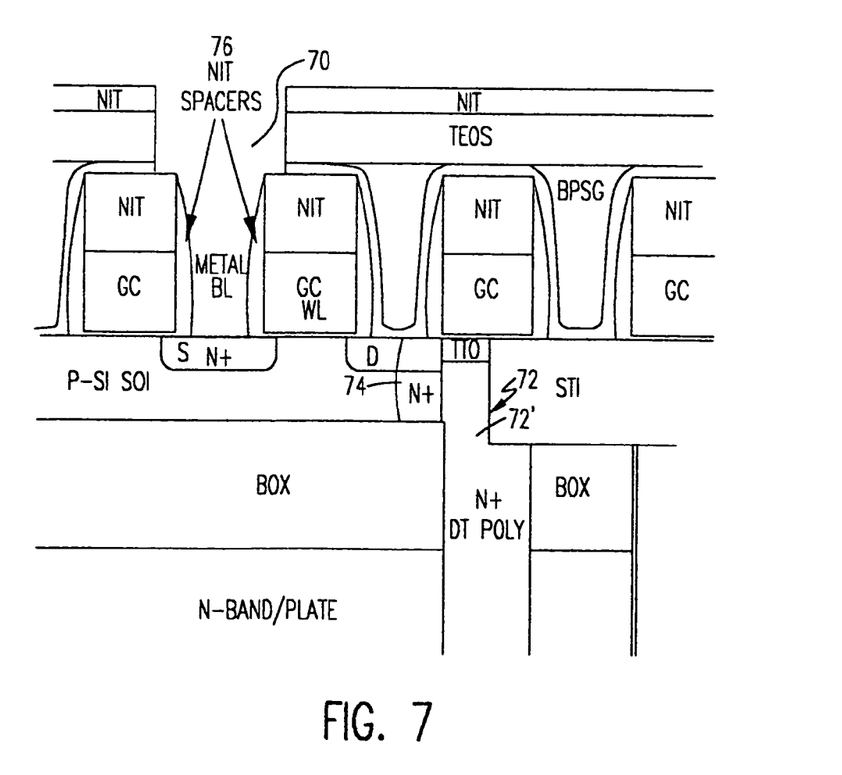
FIGS. 7, 8, 9 and 10 are cross-sectional views illustrating manufacture of a second embodiment of the invention.

FIG. 7 shows, in cross-section, an exemplary storage cell of a DRAM array with associated selection transistors and a storage capacitor 72 in place. However, it should be understood that this embodiment of the invention is equally applicable to any type of integrated circuit (e.g. processors, gate arrays, ASICs and the like) and that the invention is not limited to memory arrays and does not rely on the presence of the storage capacitor shown. The gate connections GC are word lines of the array while bit line stud connections are formed between the transistors in region 70 to bit lines which run parallel to or in the plane of the page. The word lines may be considered as extending in a direction perpendicular to the plane of the page, with bit lines running orthogonal to the word lines, although even this configuration should be regarded as exemplary. It should also be understood that a word line/control gate GC may be a dummy structure to provide the desired anti-fuse structure and may not serve any electrical purpose.

A diffusion 74 is provided as a contact to the storage node 72' of the capacitor 72 and a trench top oxide (TTO) is preferably provided where word line connections to transistors in front of and behind the plane of the page cross above the capacitor 72 in order to reduce noise coupling. The gate connections are preferably capped with nitride (NIT) and passivation layers (e.g. TEOS) provided.

None of these preferred features are important to the practice of the invention or an understanding of it. It is, however, important to an appreciation of the meritorious effects of this embodiment of the invention to recognize that the transistors are formed with a spacing which may be the minimum lithographic feature size under the design rules of the integrated circuit. Thus, the method of fabrication of a connection in accordance with the invention can be placed wherever desired among maximally dense structures. It should also be noted that the absence of a metal bit line connection in region 70 of a DRAM cell would be representative of a break in the bit line which can be repaired by use of the invention as well as a redundant partition of the memory which was not originally connected to bit lines. It should also be appreciated that the—source diffusion S is optional but is preferred at least because avoidance of it may require an extra masking step, even if it has no function. (Trench polysilicon 72' is contacted through diffusion D overlying strap diffusion 74 whereas the contact is landed directly on the inner electrode of the anti-fuse of the first embodiment.) It may also serve to connect to a bit line segment in front of or behind the plane of the page in FIG. 7.

Figure 8:
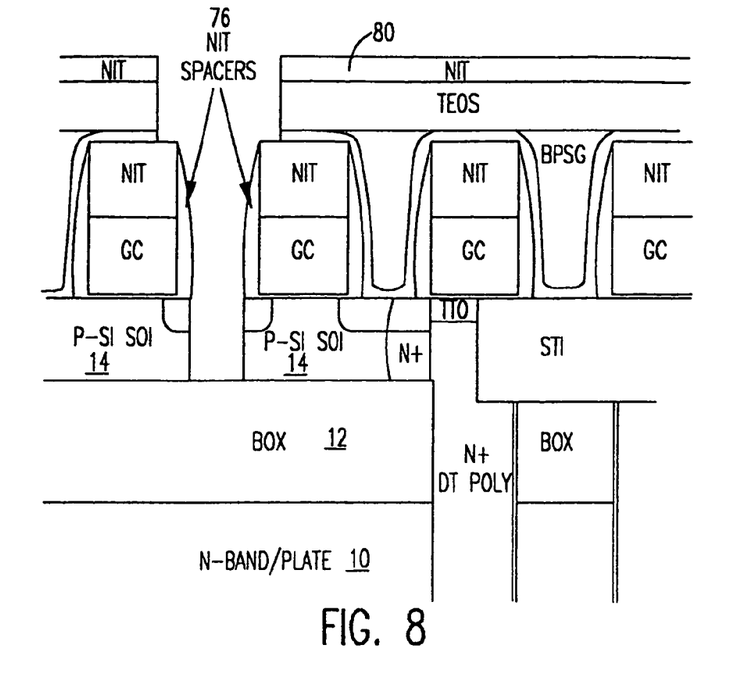
Figure 9:
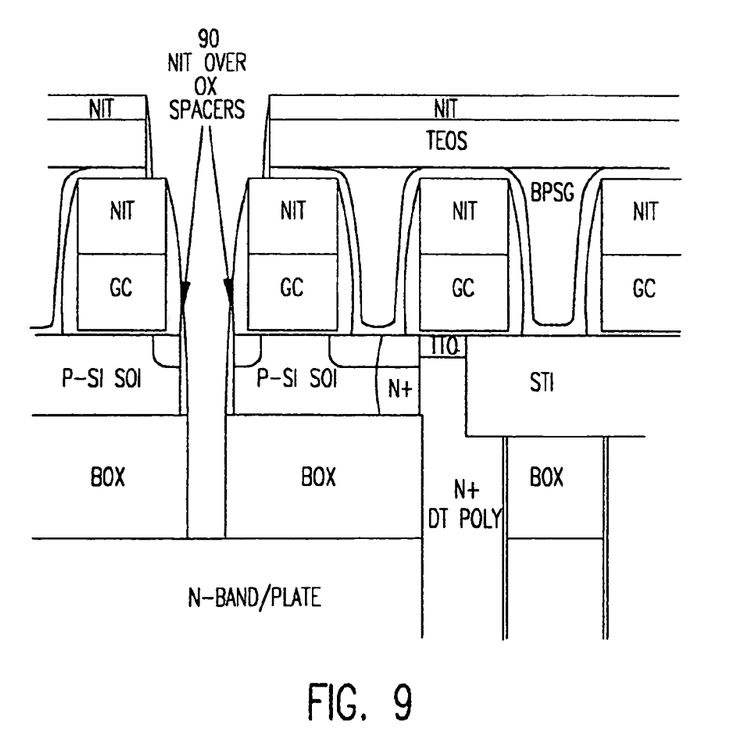
Figure 10:
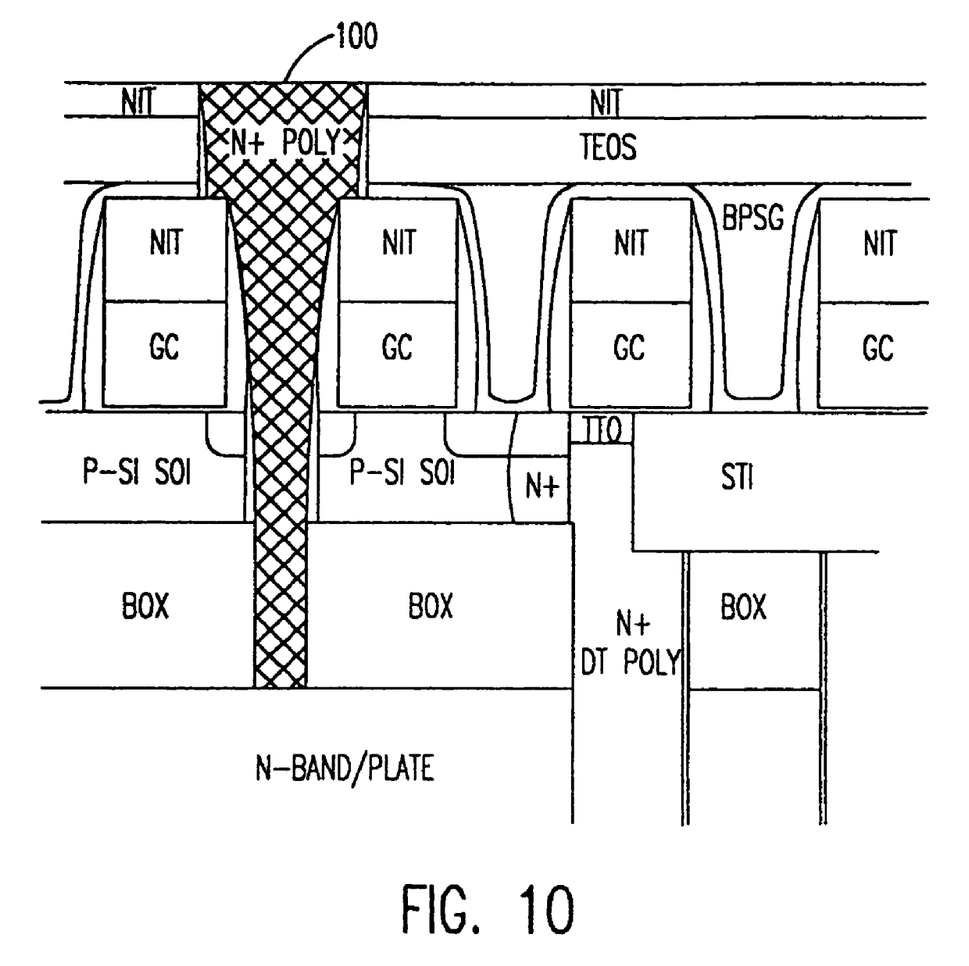

As further shown in FIG. 7, the passivation layers have been opened at the location where the connection is to be formed. As shown in FIG. 8, using the passivation layers (e.g. a nitride top layer 80) and nitride sidewall spacers 76 formed on the sides of the transistor gates as hard mask, the silicon active device layer 14 is etched to the back oxide 12. Then, as shown in FIG. 9 further nitride or composite (e.g. nitride over grown oxide) sidewalls/collar 90 are developed over the existing nitride sidewall spacers and within the via through the active device silicon layer 14. A via can then be etched though the back oxide (BOX) 12 to the bulk silicon layer 10. The via now extends from the surface of the passivation layers to the bulk silicon layer and can be filled with doped polysilicon to complete the connection as shown at 100 of FIG. 10.

It is much preferred to provide spacers/collar 90 of a thickness which will resist breakdown at operating voltages or at voltages which may be used to program the capacitor structure 72, should the facility for such programming be desirable, consistent with adequate conductivity of the doped polysilicon fill 100. That is, increased thickness of sidewalls/collar 90 will reduce the cross-section of connection 100 and increased resistance due to decreased cross-section may not necessarily be compensated by increase of dopant compensation unless sidewall thickness is suitably limited. In this way breakdown of the capacitor dielectric can be achieved without causing breakdown elsewhere in the structure.

(It should be noted, in this regard, that while the conductors of FIGS. 2-5 were identified as "programmable" and "non-programmable", conductor 100 is non-programmable once formed but programmable in the sense that its location and formation may be selectively chosen. The capacitor structure 72 is also (separately) programmable, if desired, in the same manner as the programmable conductor 42 (FIG. 5A), which, if not programmed by intentional damage to the dielectric, can also be used as a capacitor.)

This structure may be used in several ways. If suitable isolation is provided, the capacitor 70 can be read as a two terminal device. The connection can also be used to repair, for example, bit lines or to connect redundant devices to replace marginal or inoperative devices. Further, since both electrodes of the capacitor are available, the capacitor dielectric can be damaged by an overvoltage to program the anti-fuse. Other uses and ancillary structure to accommodate them will be evident to those skilled in the art in view of the present disclosure. In any event, the connection in accordance with this second embodiment of the invention is potentially of a size which can be placed at any location in an integrated circuit including features spaced at minimum lithographic feature size and can be formed at any stage of manufacture of the integrated circuit that includes the devices or structures between which it is to be placed.

Therefore, the second embodiment of the invention is fully complementary to the first embodiment of the invention and the two embodiments provide for repair of any portion of an integrated circuit at any stage of wafer processing and chip manufacture. The processes of the first embodiment have no effect on the heat budget of the remainder of the integrated circuit and the effects of the second embodiment on heat budget may be minimized by suitable choice of low temperature processes.

In view of the foregoing, it is seen that the invention provides an anti-fuse structure of small footprint size potentially smaller than the minimum lithographic feature size of the integrated circuit design which can be formed in a self-aligned manner interstitially between other closely spaced structures. The anti-fuse in accordance with the invention can be programmed with a low voltage and current and may be thermally isolated from other structures such that the heat incident to programming does not affect other structures of the integrated circuit. The complementarity of the embodiments disclosed above allow the provision of anti-fuse and engineering change structures to be developed to repair circuits at any stage of manufacture including periods after the integrated circuit is placed in service.

While the invention has been described in terms of a single preferred embodiment, those skilled in the art will recognize that the invention can be practiced with modification within the spirit and scope of the appended claims.

The invention claimed is:

1. A method of producing an apparatus, comprising the steps of:

forming a dielectric layer on a bulk semiconductor layer;

forming a device layer on said dielectric layer;

etching a trench through said device layer and said dielectric layer into said bulk layer, said trench having sidewall portions adjacent said dielectric layer and said device layer;

forming an insulator layer having a first thickness on and covering an interior surface of said trench within at least said bulk layer;

forming an insulator layer having a second thickness greater than said first thickness within said trench at least covering said sidewall portions adjacent said device layer above said bulk layer;

filling said trench with conductive material to at least said insulator of said second thickness such that said conductive material is separated from said device layer at said sidewall portions by said insulator layer having said second thickness; and forming a first electrical contact to said conductive material and a second electrical contact to said bulk layer.

2. The method according to claim 1, further comprising the step of coupling voltage terminals to the first and second electrical contacts for providing a voltage between the conductive material and the bulk layer.

3. The method according to claim 1, further comprising the step of providing a voltage between the conductive material and the bulk layer sufficient to short them together through the insulator having the first thickness.

4. The method according to claim 1, further comprising the step of electrically isolating the bulk layer and a region of the device layer near the trench from each other by the dielectric layer and by the insulator having the second thickness.

* * * * *